United States Patent [19]

Nakashima

[11] Patent Number: 5,703,541
[45] Date of Patent: Dec. 30, 1997

[54] RING OSCILLATOR WITH TWO INVERTERS PER UNIT INVERTER CIRCUIT

[75] Inventor: Teruya Nakashima, Kanagawa, Japan

[73] Assignees: Mitsubishi Denki Kabushiki Kaisha; Mitsubishi Electric Engineering Co., Ltd, both of Tokyo, Japan

[21] Appl. No.: 821,315

[22] Filed: Mar. 20, 1997

Related U.S. Application Data

[63] Continuation of Ser. No. 537,120, Sep. 29, 1995, abandoned.

[30] Foreign Application Priority Data

Jun. 5, 1995 [JP] Japan ................................ 7-137870

[51] Int. Cl.$^6$ ................................................ H03B 5/24
[52] U.S. Cl. ............................ 331/57; 331/45; 327/261; 327/269
[58] Field of Search ........................ 331/57, 116 FE, 331/177 R, 45, 135; 327/231, 235, 238, 243, 261, 269, 271, 272, 264

[56] References Cited

U.S. PATENT DOCUMENTS 4,988,960  1/1991  Tomisawa ........................ 331/57 X
5,448,205  9/1995  Rothermel ........................ 331/57
5,469,120  11/1995  Nguyen et al. ................ 331/177 R
5,568,103  10/1996  Nakashima et al. .

*Primary Examiner*—Robert Pascal
*Assistant Examiner*—Arnold Kinkead
*Attorney, Agent, or Firm*—Oblon, Spivak, McClelland, Maier & Neustadt, P.C.

[57] ABSTRACT

A ring oscillator shortens the delay time between consecutive delayed clock signals, and increases of the number of delayed clock signals, without changing the oscillation frequency f of the ring oscillator and the number of stages n of inverter in one loop, and holding the same control current/oscillation frequency. The ring oscillator has odd numbers of unit inverters, wherein the unit inverter comprises two serial circuits connected in parallel each comprising of P channel transistor and N channel transistor, constant current sources connected to P channel and N channel sides in these parallel circuits, respectively, which are controlled by a current control circuit.

9 Claims, 11 Drawing Sheets

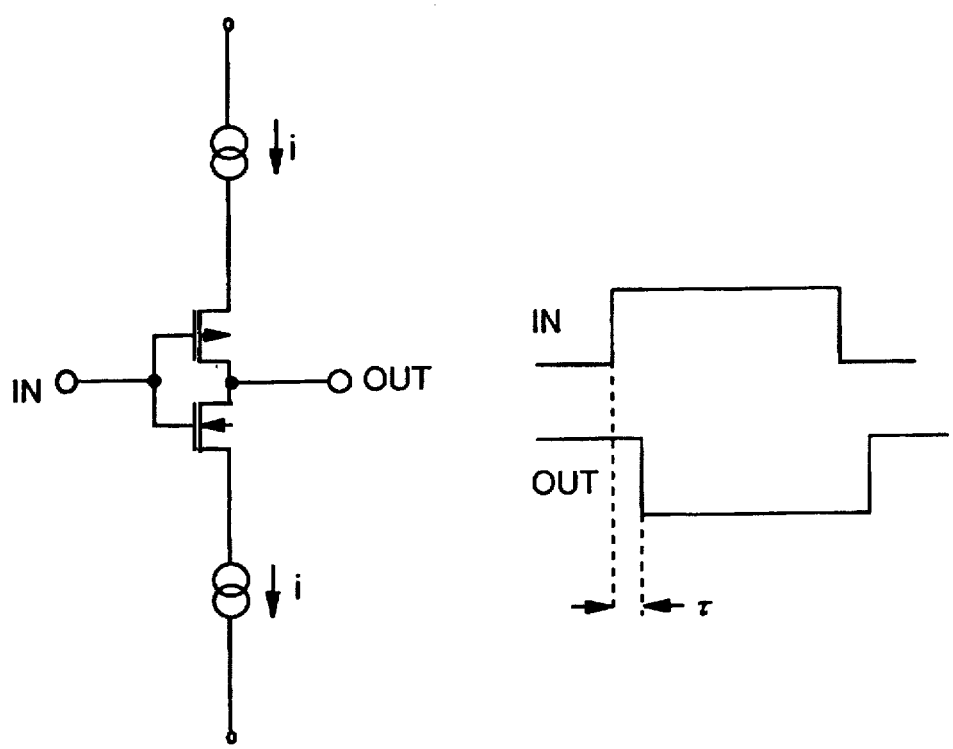
FIG. 11A
PRIOR ART
FIG. 11B
PRIOR ART
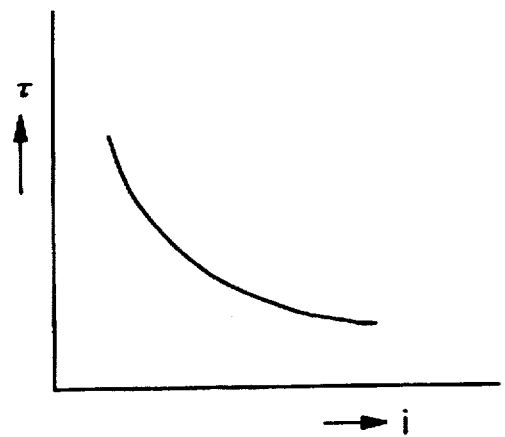
FIG. 11C
PRIOR ART

RING OSCILLATOR WITH TWO INVERTERS PER UNIT INVERTER CIRCUIT

This application is a continuation of application Ser. No. 08/537,120, filed on Sep. 29, 1995, now abandoned.

BACKGROUND OF THE INVENTION

1. Field of the Invention

The invention relates to a ring oscillator circuit comprising CMOS. In particular, the present invention relates to a ring oscillator which obtains a plurality of clock signals having short delay time between each pulse by using unit inverters comprising odd stage transistors and of even stage transistors.

2. Description of the Prior Art

FIG. 8 shows a circuit diagram of a conventional ring oscillator. A ring oscillator circuit connects unit inverters of odd stage in a ring circuit to oscillate it by current control and to generate a clock signal. An oscillation principle of ring oscillator is briefly explained here. In FIG. 8, the numeral 19 denotes a unit inverter circuit. The unit inverter circuit comprises P channel transistor 4, N channel transistor 5, two constant current sources 2 and 3 arranged up and down stream of the transistors and which drive the transistors, respectively.

FIG. 9 shows a phase timing chart of output signal from each inverter in a conventional ring oscillator. The delay time τ is a function of current which is supplied by up and down constant current sources 2 and 3. FIG. 11A shows a CMOS inverter circuit which constitutes a conventional ring oscillator. FIG. 11B shows a timing chart of input and output of the CMOS inverter. FIG. 11C shows a chart showing a relationship between current which is supplied by constant current source and delay time τ between input and output. As shown in FIG. 9 and FIG. 11B, delay time between input and output terminals of each inverter, that is, delay time of inverter is τ per a stage. Also, as shown in FIG. 11C, when current supplied by constant current sources 2 and 3 is increased, delay time τ between input and output decreases. As shown in FIG. 8, a ring oscillator is comprised of n stage (odd) unit inverter mentioned above connected in cascade.

Constant current sources 2 and 3 which drive inverter are controlled by current control circuit 9. For example, when input of inverter in the first stage is logic "H", logic "L" is outputted as output Vn of inverter in the last stage (n stage) after nτ. Since output of the last stage is connected with input of the first stage, the change of output in the last stage to logic "L" inverts the polarity of the first step to logic "L". After nτ time, output of the last stage and input of the first stage is inverted to logic "H" again.

In this way, all the output terminals repeat logic "H" and logic "L" which result in self-oscillation of an oscillator. Assuming oscillation frequency at this time as f (=1/T:T is a period of oscillation frequency), delay time τ per stage of an inverter becomes $$\tau = (1/f)/2n = \frac{1}{2}nf = T/2n \quad (1)$$

Clock signal generated in each inverter of ring oscillator may be taken out as $V_1, V_2, V_3 \ldots V_n$. Timing chart of signals at these terminal is shown in FIG. 9. Clock signals outputted from each of the successive inverters are queued up in a sequence of $V_1, V_2, V_3, \ldots V_{n-1}, V_n$ and delay time of each clock is τ.

These clocks can be used in various kinds of combination in accordance with a request of a system. For example, when assembling these clock signals as a delay signal having successive rising edge, they are lined up as $V_1, V_3, \ldots V_n$, $V_2, V_4, \ldots V_{n-1}$ and delay time "a" of these adjacent signals is a delay time for two stages of unit inverter circuit 19 in FIG. 8 and shown as follows.

$$a = 2\tau = (1/f)/n = 1/nf = T/n \quad (2)$$

FIG. 10 shows all the delay clock signals in case the number of stages in the unit inverter circuit in FIG. 9 is 13, for example. In this case, output clock signals with continuous rising edge are lined up as $V_1, V_3, V_5, V_7, V_9, V_{11}, V_{13}$, $V_2, V_4, V_6, V_8, V_{10}, V_{12}, V_1, \ldots$ Delay time of these adjacent signals becomes $2\tau = (1/f)/n = 1/nf$. In other words, delay time of successive delay clock signals is always 2τ. Even though the number of inverter stage is increased in order to obtain more clock delay signal, delay time between the delay clock signals cannot be shortened. Even if stage number of inverter is increased, it can not be shortened. The only way to shorten the delay time is to increase current of constant current source as shown in FIG. 11C.

A signal processing in a system where various widths of recording signals such as HDD (hard disk drive) and a ODD (optical disc drive) exist, many delay signals of high accuracy are needed in comparison with a reference signal generated in PLL and such. In order to meet such needs, it has been necessary to shorten delay time furthermore in conventional ring oscillator, or, to increase oscillation frequency. Also, in order to increase the number of output of delay signal, number of inverter stages and control current is needed to be increased.

However, to increase the number of output of delay signal, it is necessary to increase the number n of inverter stages. As shown in formula (1), oscillation frequency f of ring oscillator decreases in inverse proportion to stages n of the inverters. Therefore, when control current is constant, an increase of inverter stages n resulted in the fall of frequency. Rise of control current is needed to increase oscillation frequency land delay time τ. As shown in FIG. 11C, them has been a limit in raising oscillation frequency by increasing control current since delay time τ nears saturation according to increase of control current i when control current i becomes large.

Furthermore, increase of unit inverter circuit 19 means to increase stages of constant current sources 2 and 3. Since constant current source needs a big area inside IC, increase of unit inverter circuits 19 is not desirable. In other words, it has been difficult to decrease delay time τ in conventional unit inverter. And when the number of unit inverter is increased to increase the number of delay signal, there arises an inconvenience of large IC circuit area.

It is an object of the present invention to shorten delay time τ of successive delay signals and to increase the number of delay signals without changing oscillation frequency f and inverter stages n in a loop inside the ring oscillator under the same control current/oscillation frequency characteristics.

SUMMARY OF THE INVENTION

According to one aspect of the invention, unit inverter in a ring oscillator having odd numbers of unit inverters comprises two serial circuits connected in parallel each comprising P channel transistor and N channel transistor, and constant current sources connected to P channel and N channel sides in these parallel circuits, respectively, which are controlled by a current control circuit.

According to another aspect of the invention, unit inverter in a ring oscillator having odd number of unit inverters comprises two serial circuits connected in parallel comprising P channel transistor and N channel transistor, wherein P channel side connected to a constant current source controlled by a current control circuit in these parallel circuits, and N channel side of the inverter is grounded to the earth.

According to another aspect of the invention, unit inverter in a ring oscillator having odd numbers of unit inverters comprises two serial circuits connected in parallel comprising of P channel transistor and N channel transistor, wherein N channel side of the inverter is connected to a constant current source controlled by a current control circuit in these parallel circuits, and P channel side of the inverter is connected to current source.

According to further aspect of the invention, outputs of odd number of inverter side in unit inverter circuit of i stage (i=1~n) in a ring oscillator is connected to inputs of odd number of inverter side in unit inverter circuit of (i+1) stage, outputs of even number of inverter side is connected to inputs of even number of inverter side in unit inverter circuit of (i+1) stage, and clock signals ($V_1, V_2, V_3, \ldots V_{(2n-1)}, V_{2n}$) are obtained from clock terminals connected to output terminals of odd inverter side and output terminals of even inverter side.

According to further aspect of the invention, clock signals in a ring oscillator are taken out of said clock terminals in the order of $V_1, V_4, V_5, V_8, V_9, \ldots V_{2(n-1)}, V_{(2n-1)}, V_2, V_3, V_6, V_7, V_{10}, \ldots V_{2(n-1)-1}, V_{2n}, V_1, V_4$.

According to further aspect of the invention, clock signals in a ring oscillator are taken out of said clock terminals in the order of $V_2, V_3, V_6, V_7, V_{10}, \ldots V_{2(n-1)-1}, V_{2n}, V_1, V_4, V_5, V_8, V_9, \ldots V_{2(n-1)}, V_{(2n-1)}, V_2, V_3$.

BRIEF DESCRIPTION OF THE DRAWINGS

FIG. 11A shows a CMOS inverter circuit which constitutes conventional ring oscillator.

FIG. 11B shows a timing chart of input and output signals of CMOS inverter.

FIG. 11C shows relationship between current supplied by constant current source and delay time τ between input and output signals.

DETAILED DESCRIPTION OF THE PREFERRED EMBODIMENTS

Embodiment 1

Figure 1:
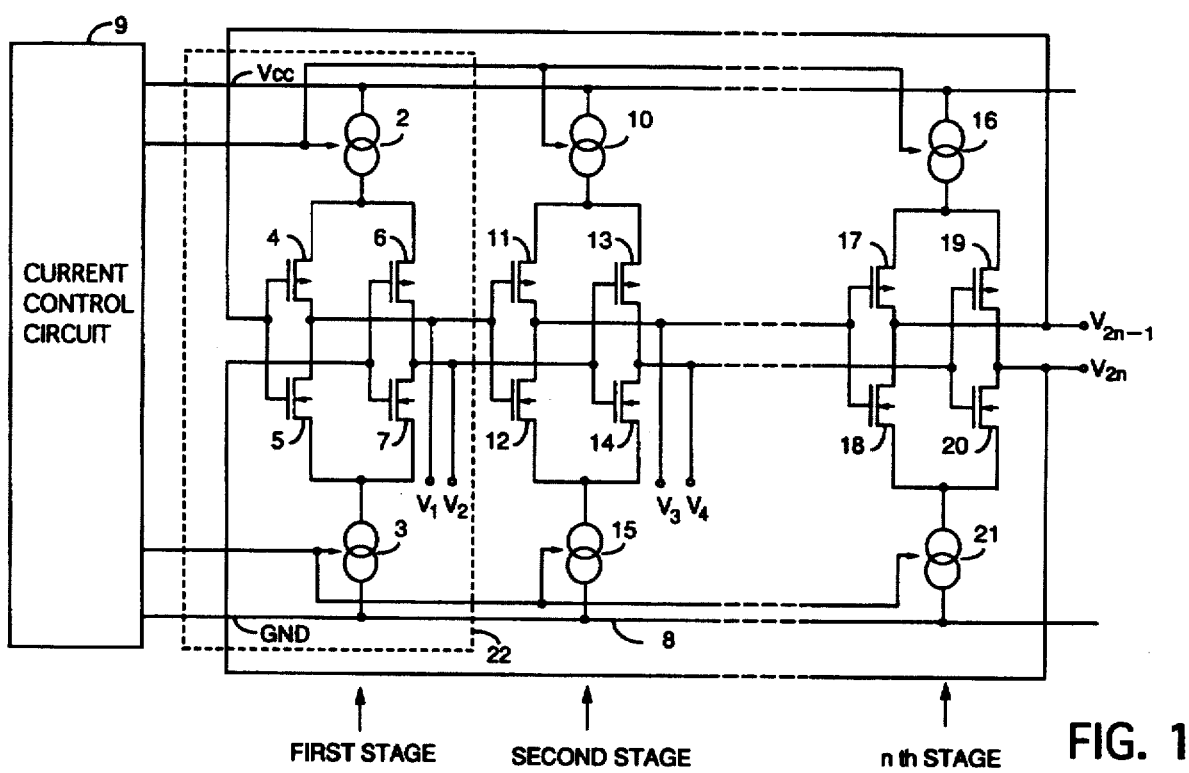
FIG. 1 is a block diagram showing a CMOS ring oscillator circuit of a first embodiment of the present invention.

FIG. 1 shows a ring oscillator of a first embodiment of the present invention. In FIG. 1, the numeral 9 denotes a current control circuit, the numerals 2, 3, 10, 15, 16, 21 denote constant current sources, the numerals 4, 5, 6, 7, 11, 12, 13, 14, 17, 18, 19, 20 denote transistors, the numeral 22 denotes a unit inverter circuit which constructs a unit of ring oscillator and $V_1, V_2, V_3, \ldots V_{2n-1}, V_{2n}$ denote output clock signals.

All the constant current sources in FIG. 1 controlled by current control circuit 9 receive current mirror of the same current. Ring oscillator of n odd stages starts self-oscillation as a result of;currents from the constant current sources being current mirrored. In a unit inverter circuit 22, two inverters share constant current sources 2 and 3. Once oscillation starts, the two inverters repeat an operation wherein one output is logic "H" while the other is logic "L".

A ring oscillator of the present invention connects a unit inverter circuit 22 to n odd number of stages in a ring shape connected in cascade. With regard to the two inverters inside a unit inverter circuit 22, an inverter comprising transistors 4 and 5 on the left-hand side is called an odd numbered inverter and an inverter comprising transistors 6 and 7 on the right-hand side an even numbered inverter. Then, an overall ring oscillator circuit comprises a ring to which only the odd number of inverters are connected and a ring to which only the even number of inverters are connected, where the odd and the even inverters share a constant current source.

Odd number of inverters and even number of inverters oscillate as ring oscillators of different loops. Since each number of inverters have their constant current source in common, this current flows transiently in any one of odd number of inverters or even number of inverters. Therefore, output signal between two ring oscillators becomes completely reverse-phase, one of which comprises odd number of inverters, the other comprises even number of inverters.

Suppose logical "H" is inputted into the input terminal of odd number of inverter, which is one of the odd number of inverters comprising transistors 4, 5 and the even number of inverters comprising transistors 6, 7 in inverter circuit portion 22 in FIG. 1, P channel transistor 4 turns off, and N channel transistor 5 turns on. At this moment, constant current source 3 transiently takes off charge from odd stage of inverters comprising succeeding stage transistors 11, 12 through transistor 5, then causes input logic to turn into "L", which is an odd stage of inverters comprising transistors 11, 12.

On the other hand, logic "L" inputs into the input terminal of even number of inverters 6, 7. At this time, P channel transistor 6 turns on, and N channel transistor 7 turns off. At this moment, constant current 2 transiently supplies charge to even number of inverters comprising succeeding stage transistors 13, 14 through transistor 6, and causes input logic of even number of inverter comprising transistor 13, 14 to turn into "H".

In this way, when logical "H" is inputted into the input terminal of odd number of inverter, and logical "L" is inputted into the input terminal of even number of inverter on the first stage, an inversion of the preceding state of each odd and even number of inverters are inverted. The odd number of inverter comprising transistors 4, 5 and even number of inverter comprising transistors 6, 7 output reverse-phase of logical "L" and logical "H", respectively. In this way, output of following stages become reverse-phase one after another, then, two loops of odd number and even number show complete reverse-phase oscillation as a whole.

Figure 2:
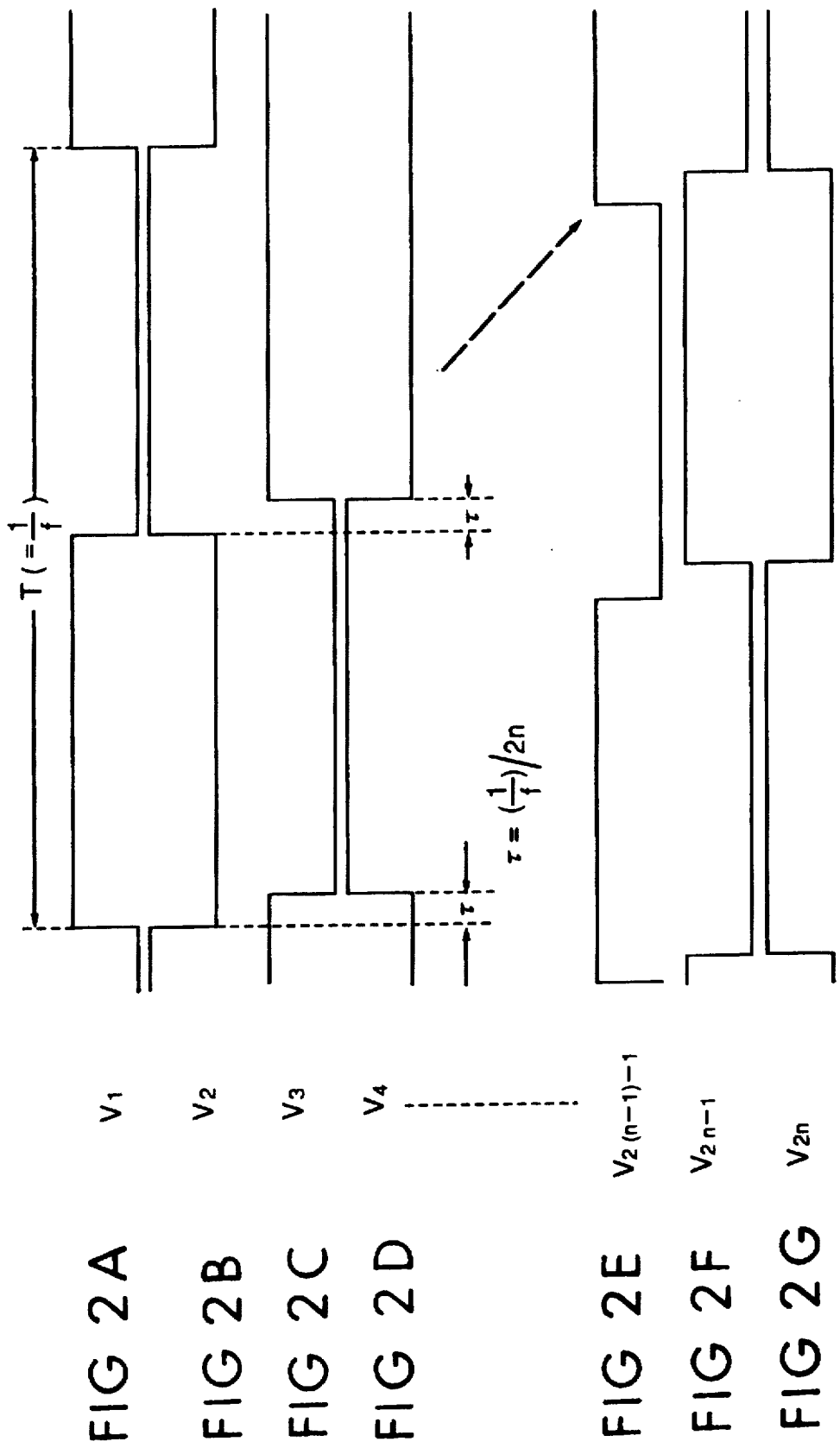
FIG. 2 shows a timing chart of output signals in the circuit of FIG. 1.

FIG. 2 shows a timing chart of each output signal in the ring oscillator circuit shown in FIG. 1. In this ring oscillator circuit, clock signals of all output terminals are used as delay signals in reference to a certain clock signal (for example, $V_1$). For example, when making delay signals with consecutive rising edges, the order of the signals becomes $V_1, V_4, \ldots V_{2(n-2)-1}, V_{2n}, V_4, \ldots$. Delay time $\tau$ of these adjacent signals becomes $\tau=(1/f)/2n=\frac{1}{2}nf$. This delay time corresponds to the delay time of the unit inverter circuit portion 22 of the first stage in FIG. 1.

Further, in case of making a delay signal with consecutive falling edges, for example, the order of the signals becomes $V_2, V_3, V_6, V_7, V_{10}, \ldots V_{2(n-1)-1}, V_{2n}, V_1, V_4, V_5, V_8, V_9, \ldots V_{2(n-1)}, V_{(2n-1)}, V_2, V_3, \ldots$. Delay time $\tau$ of these adjacent signals are also $\tau=(1/f)/2n=\frac{1}{2}nf$. This delay time corresponds to delay time of unit inverter circuit portion 22 of the first stage in FIG. 1.

As for traditional ring oscillator, in case that the clock signals is used as consecutive delay signals in reference to the inverter output clock signal, intervals (delay time) between each stage of consecutive clock signals which start with rising edges, for example, are twice (=$2\tau$) than the inverter stage. As for the present invention, however, delay time is shorten to as long as one inverter stage (=$\tau$). Therefor, it can get twice as many clock signals as conventional ring oscillator gets for the same frequency.

When twice number of clock signals is needed for the same frequency in the conventional technique, it must shorten the delay time to ½ using device technique. The present invention is able to shorten the delay time between clock signals to ½ using the conventional device. Because it does not change current value of constant current source comprising ring oscillator, delay time between each output clock signal can be shortened without changing the characteristics of controlled current/oscillation frequency.

In addition, in the present invention, while the number of stages becomes twice in comparison with the conventional ring oscillator, the number of constant current source is the same as the conventional ring oscillator. Therefor, while twice delay clock signals are obtained compared with the conventional ring oscillator, the size of IC circuit as a whole is almost the same since constant current source occupies the largest area of IC.

Figure 3:
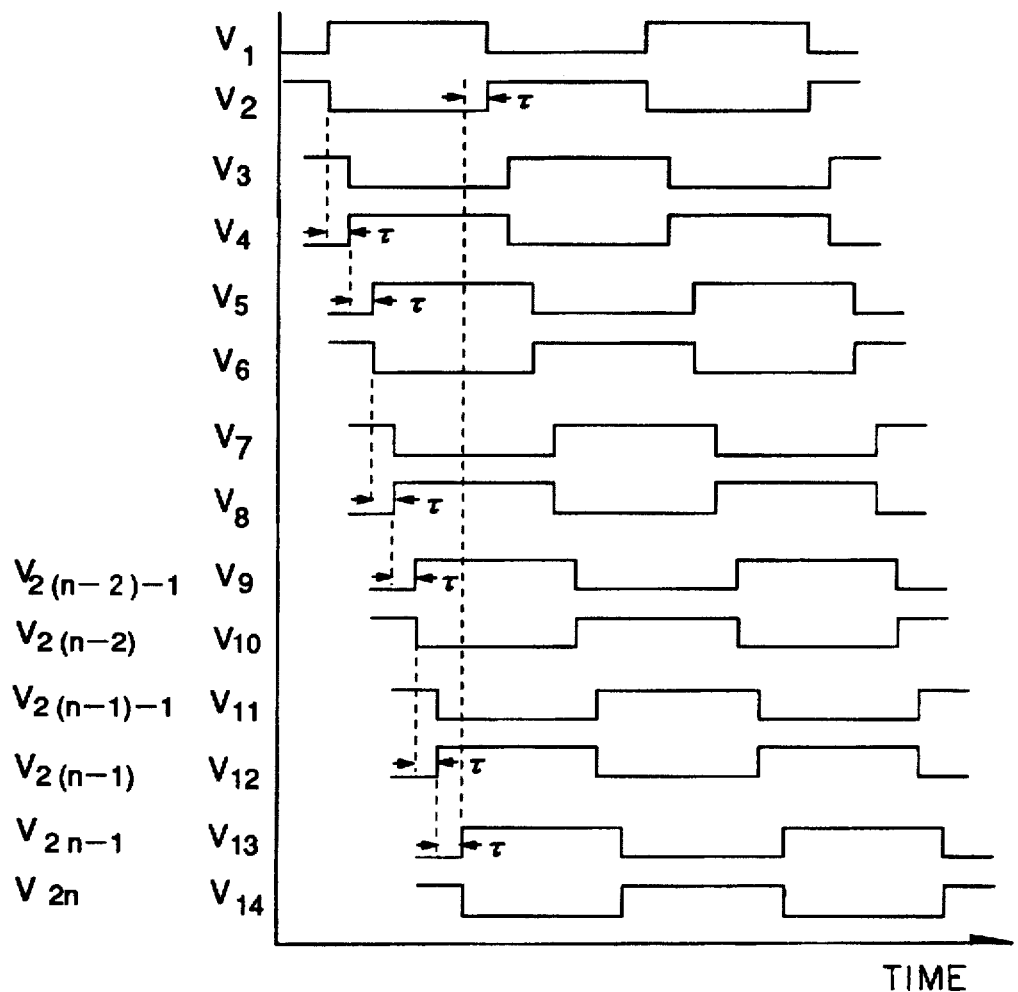
FIG. 3 shows a timing chart of output signals in the circuit of FIG. 1 in case the number of stages is 7.
Figure 10:
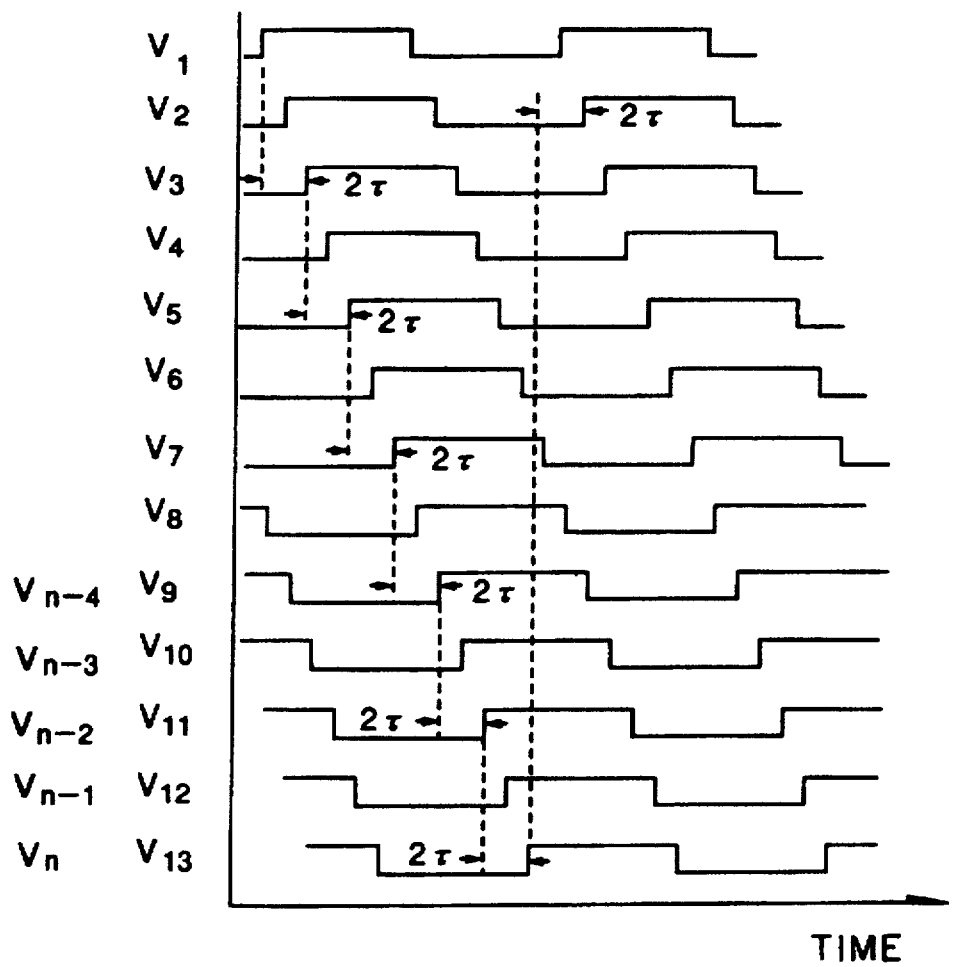
FIG. 10 shows a timing chart of output signal in the circuit of FIG. 8 in case the number of stages is 13.

FIG. 3 shows all delay clock signals in case the number of stages of unit inverter circuit in FIG. 1 is 7. In this case, the order of output signals having consecutive rising edges becomes $V_1, V_4, V_5, V_8, V_9, V_{12}, V_{13}, V_2, V_3, V_6, V_7, V_{10}, V_{11}, V_{14}, V_1 \ldots$, and delay time of these adjacent signals is $\tau=(1/f)/2n=\frac{1}{2}nf$. In comparison with conventional 13-stage ring oscillator in FIG. 10, where the same number of clock signals are obtained compared with the present invention; it is apparent that delay time of adjacent signals is $\tau$ in the present invention, but $2\tau$ in the conventional ring oscillator. Therefor, compared with conventional ring oscillator, in the present invention, delay time between each clock frequency becomes 1½ times.

Embodiment 2

Figure 4:
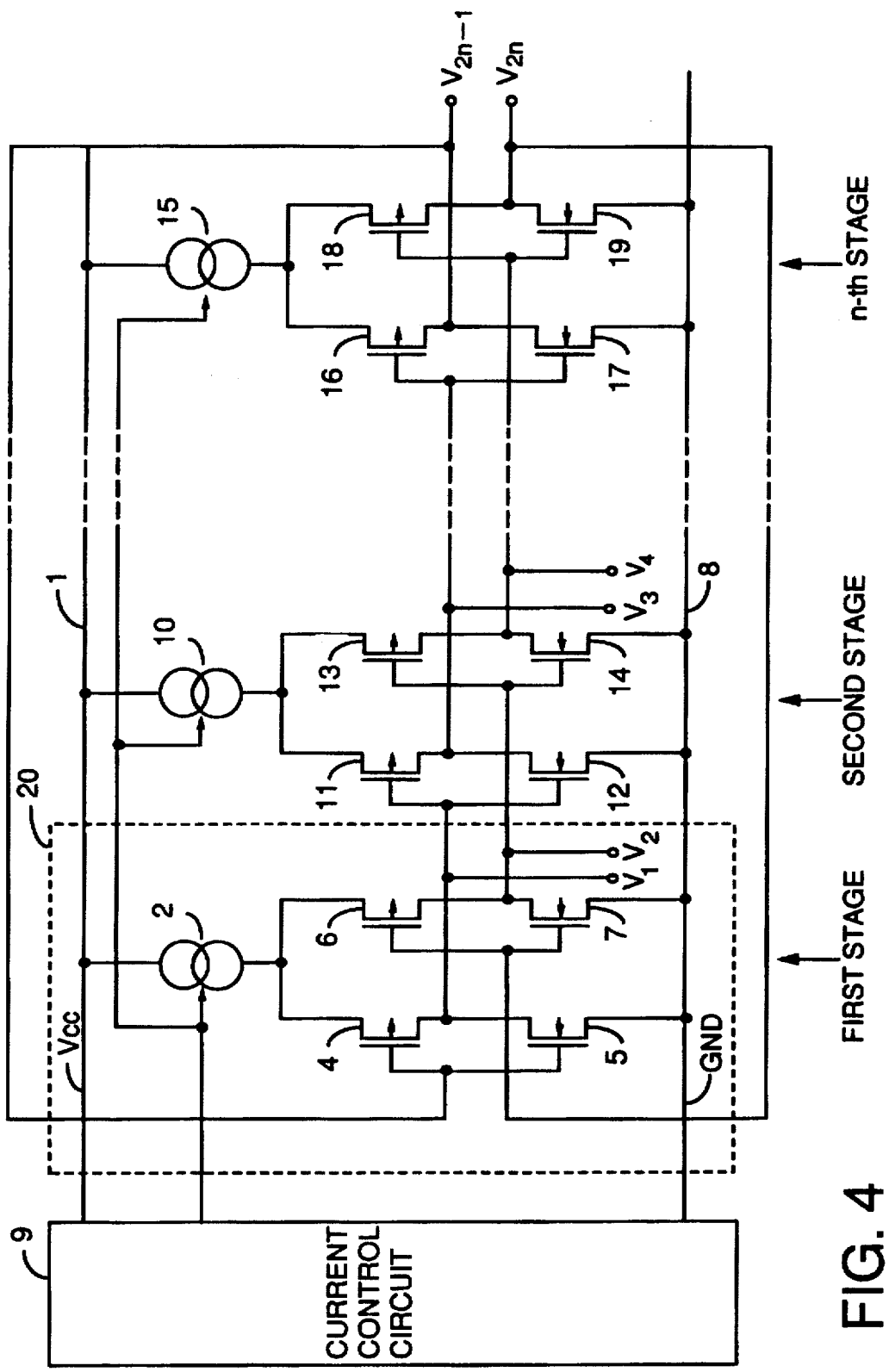
FIG. 4 shows a CMOS ring oscillator circuit of a second embodiment of the present invention.

FIG. 4 shows a CMOS ring oscillator circuit of a second embodiment in the present invention. In FIG. 4, the difference from the first embodiment is that two N channel transistors in trait inverter circuit 20 are not connected to the common constant current source, but to GND 8. Although operation of the ring oscillator in FIG. 4 is almost the same as that offing oscillator in FIG. 1, there is disadvantage of wider dispersion of falling time of output signals than in the first embodiment, since $V_{cc}$ side (falling side) can not be controlled.

Figure 5:
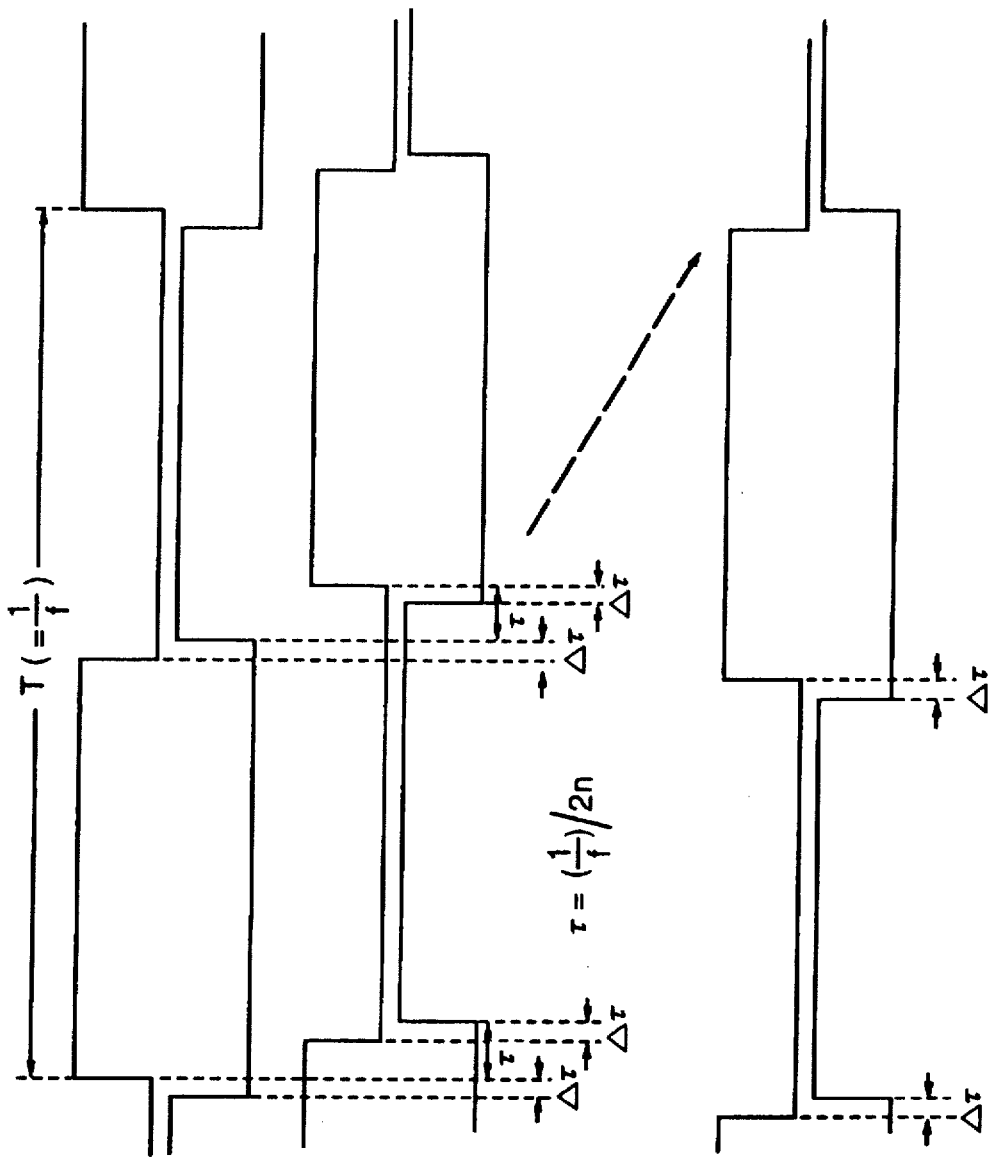
FIG. 5 shows a timing chart of output signals in the circuit of FIG. 4.

For more detailed description, as shown in FIG. 5, in pairs of outputs $V_1$ and $V_2$, $V_3$ and $V_4 \ldots$, $V_{2n-1}$ and $V_{2n}$, for example, of inverters operated with differential, falling edge advances by $\Delta\tau$ from the rising edge. However, interval between a series of assembled delay clock signals is constantly $\tau$.

However, compared with the first embodiment, it is possible to make a small-sized IC circuit, because number of constant current sources which occupy the largest area of IC. Moreover, since any one of the constant current sources can be omitted, the ring oscillator operates with low supply voltage. In this embodiment, dispersion of falling time of output signals becomes a little wider, but it can be used for a system in which delay time has a large margin of accuracy.

Embodiment 3

Figure 6:
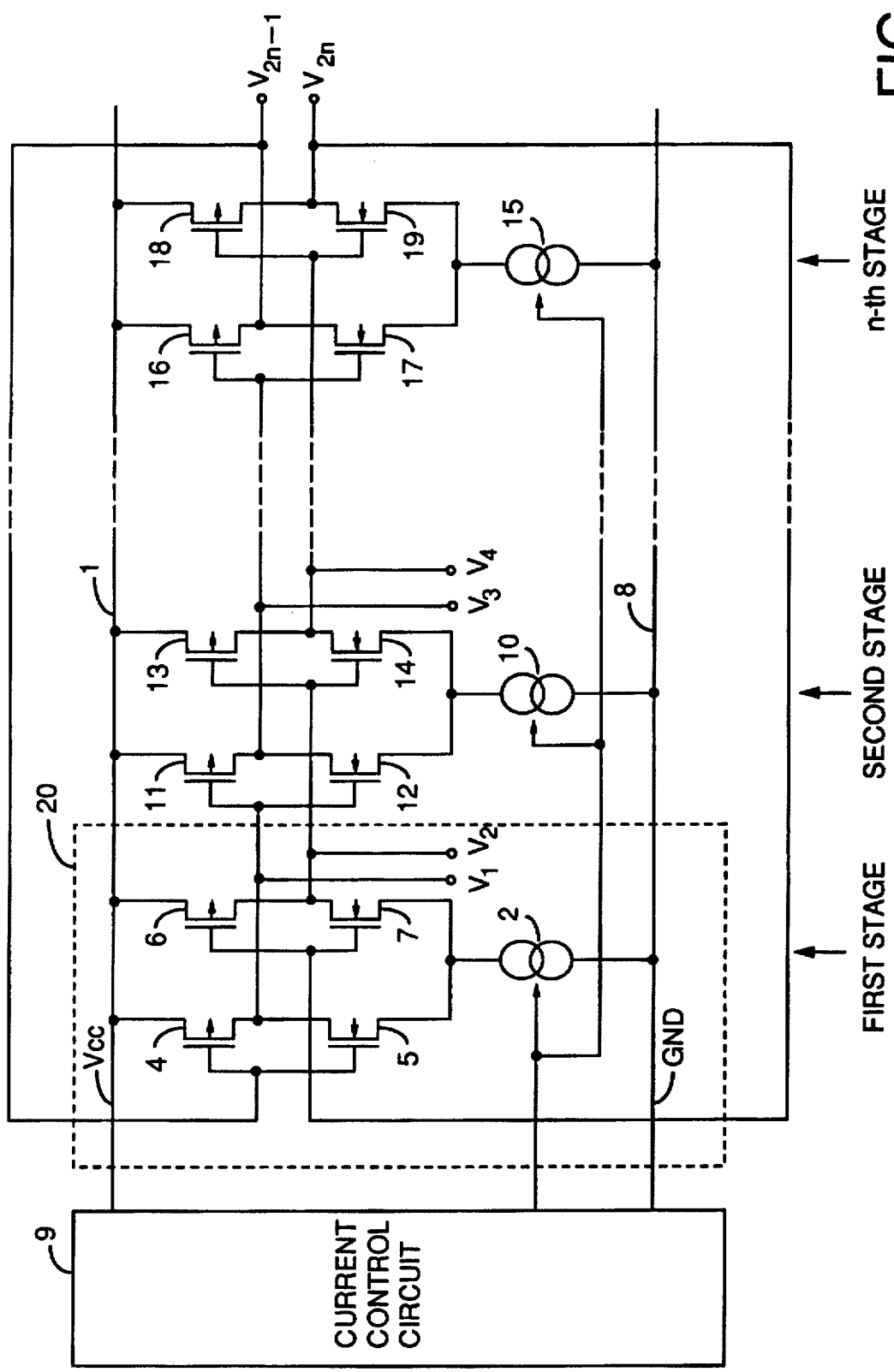
FIG. 6 shows a CMOS ring oscillator circuit of a third embodiment of the present invention.

FIG. 6 shows a CMOS ring oscillator circuit in a third embodiment of the present invention. In FIG. 6, the difference from the first embodiment is that two P channel transistors in unit inverter circuit 20 are not connected to the common constant current source, but to one voltage source $V_{cc}$. Although operation of the ring oscillator in FIG. 6 is almost the same as that of ring oscillator in FIG. 1, there is a disadvantage of wider dispersion of rising time of output signals than in the first embodiment, since $V_{cc}$ side (rising side) can not be controlled.

Figure 7:
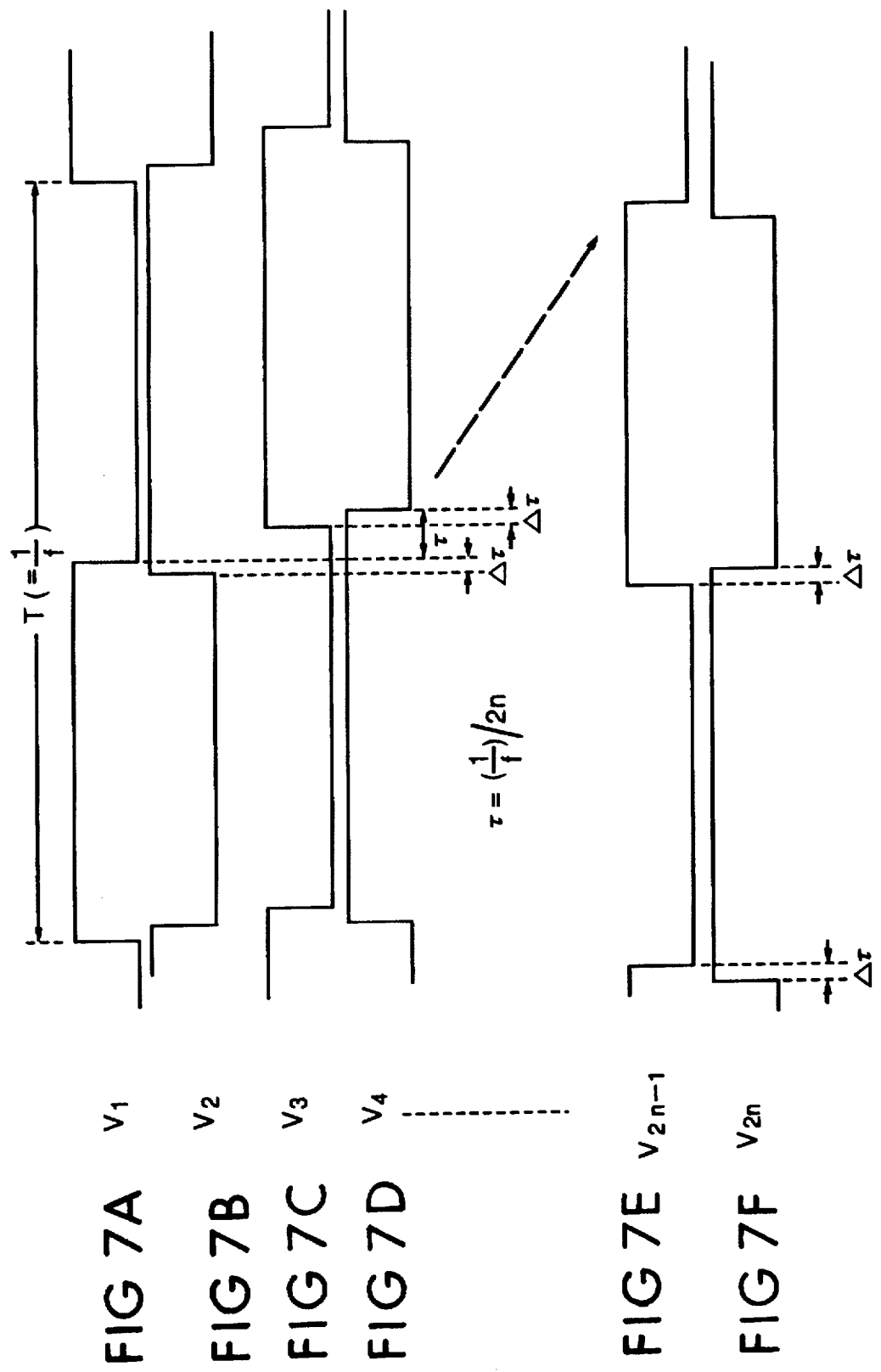
FIG. 7 shows a timing chart of output signals in the circuit of FIG. 6.
Figure 8:
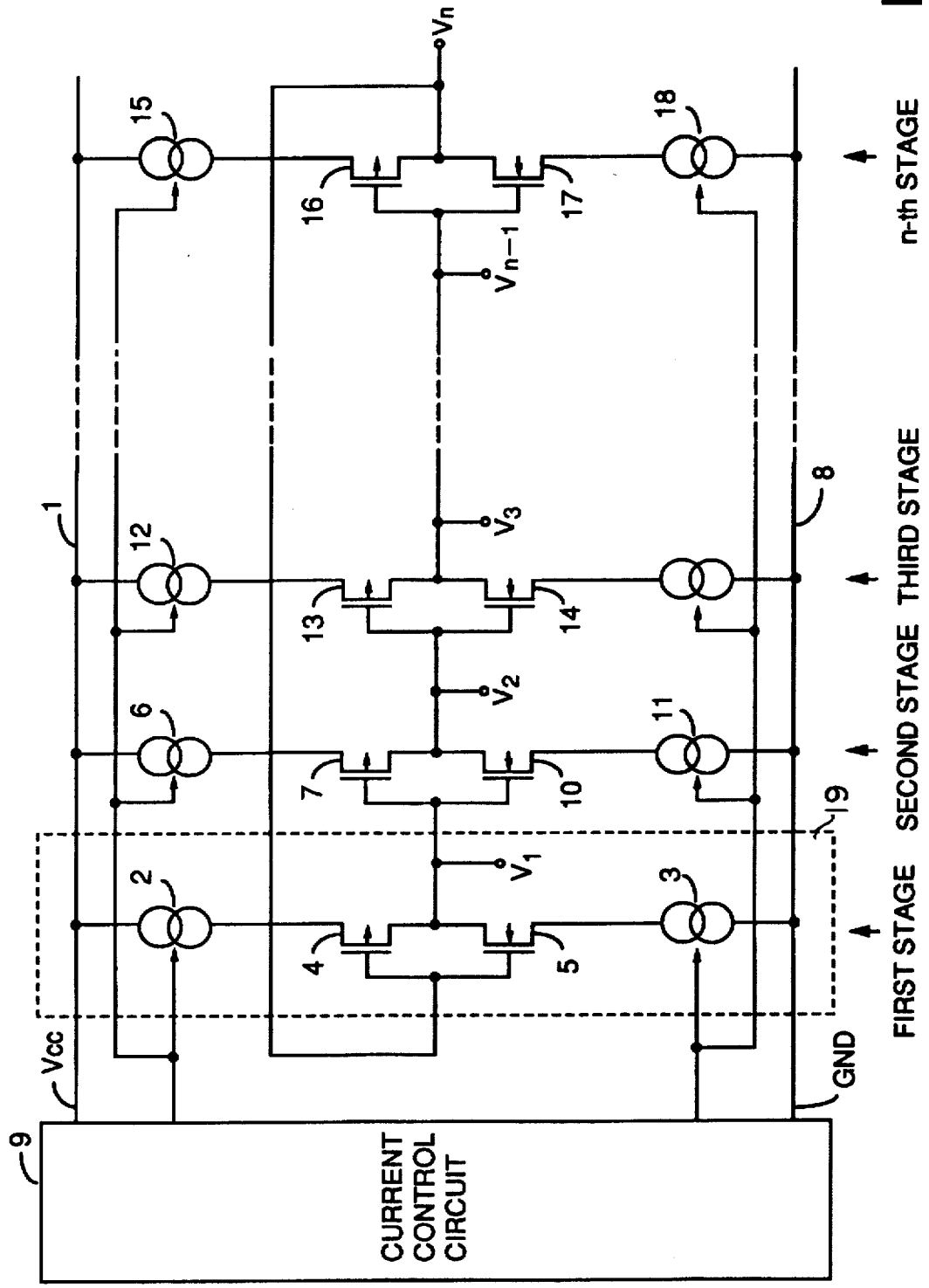
FIG. 8 shows a conventional CMOS ring oscillator circuit.
Figure 9:
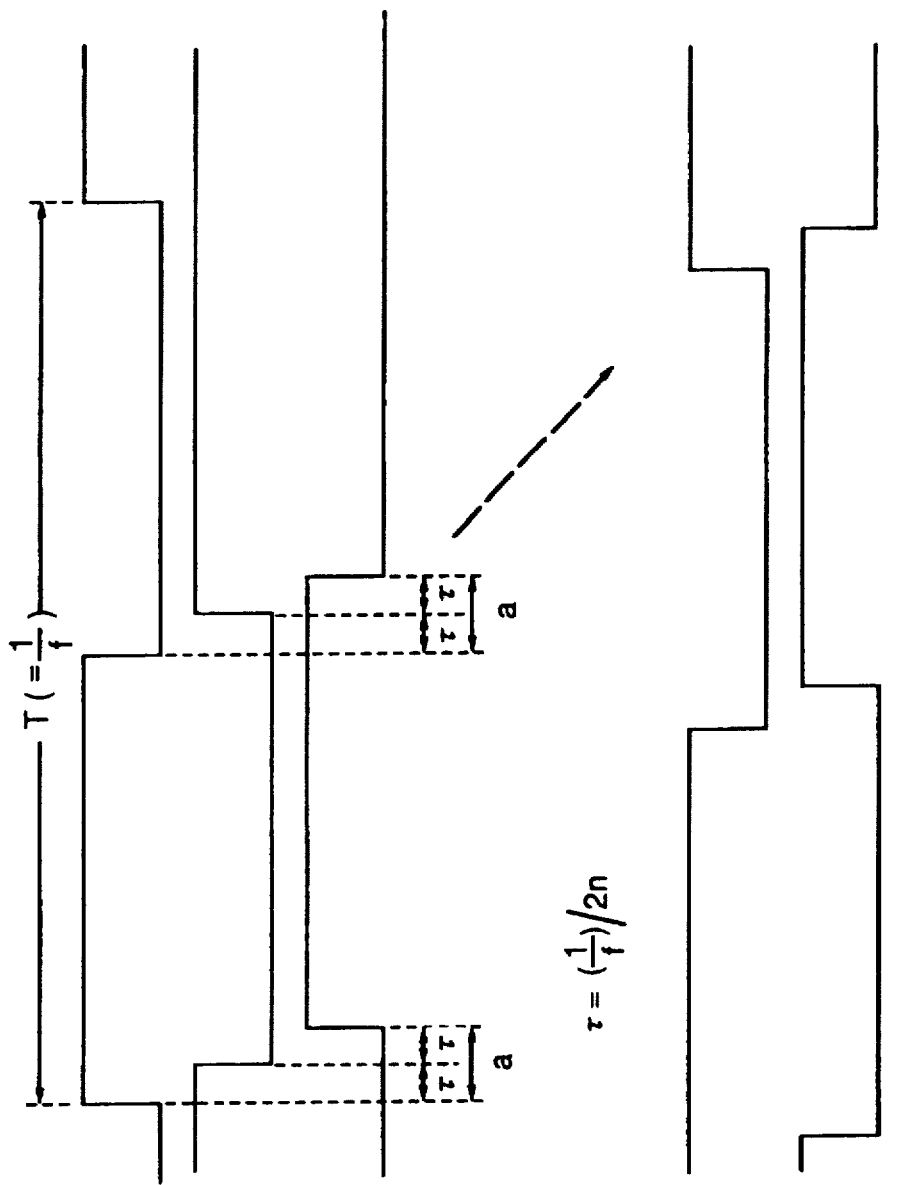
FIG. 9 shows a timing chart of output signals in the circuit of FIG. 8.

For more detailed description, as shown in FIG. 7, in pairs of outputs $V_1$ and $V_2$, $V_3$ and $V_4 \ldots$, $V_{2n-1}$ and $V_{2n}$, for example, of inverters operated with differential, falling edge advances by $\Delta\tau$ from the rising edge. However, interval between a series of assembled delay clock signals is constantly $\tau$.

However, compared with the first embodiment, it is possible to make a small-sized IC circuit, because number of constant current sources which occupy the largest area of IC. Moreover, since any one of the constant current sources can be omitted, the ring oscillator operates with low supply voltage. In this embodiment, dispersion of falling time of output signals becomes a little wider, but it can be used for a system in which delay time has a large margin of accuracy.

What is claimed is:

1. Ring oscillator having odd numbers of unit inverters, said unit inverters comprising:

first and second inverter portions connected between first and second nodes in parallel, each inverter portion including P channel transistor connected between said first node and an output node thereof outputting a clock signal, and N channel transistor connected between said second node and said output node the output from the output node of said first inverter portion in each stage circulated through the ring, the output from the output node of said second inverter portion in each stage circulated through the ring;

a first constant current source connected between a voltage source node and said first node; and a second constant current source connected between a ground potential node and said second node.

2. Ring oscillator having odd numbers of unit inverters, said unit inverter comprising:

first and second inverter portions connected between a first node and a second node connected to a ground potential node in parallel, each inverter portion including P channel transistor connected between said first node and an output node thereof outputting a clock signal, and N channel transistor connected between said second node and said output node the output from the output node of said first inverter portion in each stage circulated through the ring, the output from the output node of said second inverter portion in each stage circulated through the ring; and a constant current source connected between a voltage source node and said first node.

3. Ring oscillator having odd numbers of unit inverters, said unit inverter comprising:

first and second inverter portions connected between a first node connected to a voltage source node and a second node in parallel, each inverter portion including P channel transistor connected between said first node and an output node thereof outputting a clock signal, and N channel transistor connected between said second node and said output node the output from the output node of said first inverter portion in each stage circulated through the ring, the output from the output node of said second inverter portion in each stage circulated through the ring; and a constant current source connected between a ground potential node and said second node.

4. Ring oscillator of claim 1, wherein clock signals are taken out of the output node of said first and second inverter portions in the order of $V_1, V_4, V_5, V_8, V_9, \ldots V_{2(n-1)}, V_{(2n-1)}, V_2, V_3, V_6, V_7, V_{10}, \ldots V_{2(n-1)-1}, V_{2n}, V_1, V_4$.

5. Ring oscillator of claim 2, wherein clock signals are taken out of the output node of said first and second inverter portions in the order of $V_1, V_4, V_5, V_8, V_9, \ldots V_{2(n-1)}, V_{(2n-1)}, V_2, V_3, V_6, V_7, V_{10}, \ldots V_{2(n-1)-1}, V_{2n}, V_1, V_4$.

6. Ring oscillator of claim 3, wherein clock signals are taken out of the output node of said first and second inverter portions in the order of $V_1, V_4, V_5, V_8, V_9, \ldots V_{2(n-1)}, V_{(2n-1)}, V_2, V_3, V_6, V_7, V_{10}, \ldots V_{2(n-1)-1}, V_{2n}, V_1, V_4$.

7. Ring oscillator of claim 1, wherein clock signals are taken out of the output node of said first and second inverter portions in the order of $V_2, V_3, V_6, V_7, V_{10}, \ldots V_{2(n-1)-1}, V_{2n}, V_1, V_4, V_5, V_8, V_9, \ldots V_{2(n-1)}, V_{(2n-1)}, V_2, V_3$.

8. Ring oscillator of claim 2, wherein clock signals are taken out of the output node of said first and second inverter portions in the order of $V_2, V_3, V_6, V_7, V_{10}, \ldots V_{2(n-1)-1}, V_{2n}, V_1, V_4, V_5, V_8, V_9, \ldots V_{2(n-1)}, V_{(2n-1)}, V_2, V_3$.

9. Ring oscillator of claim 3, wherein clock signals are taken out of the output node of said first and second inverter portions in the order of $V_2, V_3, V_6, V_7, V_{10}, \ldots V_{2(n-1)-1}, V_{2n}, V_1, V_4, V_5, V_8, V_9, \ldots V_{2(n-1)}, V_{(2n-1)}, V_2, V_3$.

* * * * *